United States Patent
Li

(10) Patent No.: US 8,077,504 B2
(45) Date of Patent: Dec. 13, 2011

(54) SHALLOW TRENCH TYPE QUADRI-CELL OF PHASE-CHANGE RANDOM ACCESS MEMORY (PRAM)

(75) Inventor: Xia Li, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 315 days.

(21) Appl. No.: 12/421,011

(22) Filed: Apr. 9, 2009

(65) Prior Publication Data
US 2010/0258776 A1    Oct. 14, 2010

(51) Int. Cl.
*H01L 47/00* (2006.01)
*H01L 21/20* (2006.01)
*H01L 21/00* (2006.01)

(52) U.S. Cl. .............. 365/163; 257/2; 257/E47.001; 257/E21.09; 257/E21.001; 438/102; 438/382

(58) Field of Classification Search .......... None
See application file for complete search history.

(56) References Cited

U.S. PATENT DOCUMENTS

| | | |
|---|---|---|
| 2006/0208847 A1 | 9/2006 | Lankhorst et al. |
| 2007/0025226 A1 | 2/2007 | Park et al. |
| 2009/0011539 A1 * | 1/2009 | Jeng et al. .............. 438/107 |
| 2009/0026436 A1 | 1/2009 | Song et al. |

FOREIGN PATENT DOCUMENTS

WO    WO2007031536    * 3/2007

OTHER PUBLICATIONS

International Search Report and Written Opinion—PCT/US2010/030572—International Search Authority, European Patent Office,Jan. 5, 2011.

* cited by examiner

*Primary Examiner* — Hoai V Ho
*Assistant Examiner* — James G Norman
(74) *Attorney, Agent, or Firm* — Michelle Gallardo; Sam Talpalatsky; Jonathan T. Velasco

(57) ABSTRACT

A method of forming a phase-change random access memory (PRAM) cell and PRAM arrangement, and embodiments of phase-change random access memory (PRAM) cells and PRAM arrangements are disclosed. A phase-change random access memory (PRAM) cell includes a bottom electrode, a heater resistor coupled to the bottom electrode, a phase change material (PCM) coupled to the heater resistor, and a top electrode coupled to the phase change material. An active region between the heater resistor and the phase change material is defined by a thickness of the heater resistor.

66 Claims, 14 Drawing Sheets

SHALLOW TRENCH TYPE QUADRI-CELL OF PHASE-CHANGE RANDOM ACCESS MEMORY (PRAM)

FIELD OF DISCLOSURE

The disclosed embodiments are related to methods of forming a phase-change random access memory (PRAM) cell, and embodiments of phase-change random access memory (PRAM) cells. More particularly, the embodiments relate to methods of forming a quadri-cell of phase-change random access memory (PRAM), and embodiments of quadri-cells of phase-change random access memory (PRAM).

BACKGROUND

Phase-change memory (PCM) is an emerging memory having non-volatile features and bit access capability. Phase-change memory (PCM) beneficially provides fast read/write speeds, is durable, retains data well, and is scalable. PCM also can provide random bit access capability. Therefore, PCM may be referred to as phase-change random access memory (PRAM).

A conventional PRAM cell will now be described with reference to FIG. 1. A PRAM cell commonly includes a transistor 112 and a PRAM resistor 110. The emitter of the PRAM resistor 110 is connected in series to bit line 114, the transistor 112 is connected to word line 116, and the collector of the transistor 112 is connected to Vss 120. The PRAM resistor 110 is used as the storage element 118 of the PRAM cell.

FIG. 2 shows a conventional PRAM resistor 110 that can be used as the storage element 118 of the conventional PRAM cell of FIG. 1. A conventional PRAM resistor 110 commonly includes a phase change material (PCM) 232, a heater resistor 234, a top electrode 230, and a bottom electrode 236. An active area 238 is defined by the interface between the PCM 232 and the heater resistor 234.

The PRAM cell uses the characteristic behavior of chalcogenide glass, which can be "switched" between two states, i.e., crystalline and amorphous, by the application of heat. The phase change material (PCM) 232 of the PRAM resistor 110 commonly is formed from a phase change compound of group VI chalcogenic elements S, Se, Te with group IV and V elements. For example, conventional PRAM commonly uses a chalcogenide alloy of germanium, antimony and tellurium (GeSbTe) called GST.

The phase of the chalcogenic alloy can be changed by applying different temperatures. For example, the chalcogenide alloy can be heated to a high temperature (over 600° C.), at which point the chalcogenide becomes a liquid. Once cooled, the chalcogenide alloy is frozen into an amorphous glass-like state in which the electrical resistance of the chalcogenide alloy is high. By heating the chalcogenide alloy to a temperature above its crystallization point, but below the melting point, the chalcogenide alloy can be transformed into a crystalline state with a much lower resistance. This phase transition process can be completed in as quickly as five nanoseconds.

For example, as shown in FIG. 3A, the phase of chalcogenic alloy can be set or changed by applying different temperatures, such as Tm and Tx, for a predetermined period of time. For example, if the PCM 232 is in the amorphous phase, a lower temperature Tx can be applied to the PCM 232 for a longer period of time to set or change the phase of the PCM 232 to the crystalline phase. If the PCM 232 is in the crystalline phase, a higher temperature, e.g., above its melting point temperature Tm, can be applied to the PCM 232 for a short time to reset or change the PCM 232 to the amorphous phase.

As explained above, the amorphous phase commonly has a high resistivity and the crystalline phase commonly has a low resistivity. The PRAM cell uses the resistivity difference between the amorphous phase and the poly-crystal phase of chalcogenic alloy to provide a storing mechanism. For example, the amorphic, high resistance state can be defined to represent a binary "0", and the crystalline, low resistance state can be defined to represent a "1".

For illustrative purposes, FIG. 3B shows a pair of conventional PRAM cells. The first PRAM cell includes a top electrode 340, a phase change material (PCM) 342, a heater resistor 344, and a bottom electrode 346. A word line 348 is used to select the first PRAM cell. The second PRAM cell includes a top electrode 350, a phase change material (PCM) 352, a heater resistor 354, and a bottom electrode 356. A word line 358 is used to select the second PRAM cell. The first and second PRAM cells can share a common bit line 360.

As exemplarily shown in FIG. 3B, the first cell can be set to the crystalline, low resistance state to represent, for example, a binary "1". The second cell can be set to the amorphic, high resistance state to represent, for example, a binary "0". The application of heat by the heater resistor 354 to the PCM 352 sets or changes the phase change material to the amorphic, high resistance state in the active area 362.

With reference again to FIGS. 1-3B, the writing mechanism for the PRAM cell is provided by the self-heating resulting from the current flow (Joule effect) through the phase change material interface (e.g., the active area between the heater resistor and the PCM) of the PRAM resistor 110. The reading mechanism for the PRAM cell is provided by the resistance difference of PRAM resistor 110.

In conventional PRAM cells, the minimum size of the contact window between the phase change material (PCM) and the heater resistor film is limited by conventional design rules. That is, the minimum horizontal contact size of the heater resistor film with the PCM is limited or constrained by the conventional design rule associated with the formation of the heater resistor film (e.g., half pitch lithography resolution). Therefore, since the ability to reduce the size of the active area between the PCM and the heater resistor is limited, the minimum current needed to program the PRAM cell also is limited. Furthermore, the minimum writing current needed to program the conventional PRAM cell is limited. That is, the set current and the reset current of the conventional PRAM cell cannot be reduced beyond a minimum amount based on the size of the contact area between the heater resistor and the PCM. Conventional PRAM cells use a bipolar junction transistor (BJT) device to meet the writing current requirements and to reduce cell size.

SUMMARY

The disclosed embodiments are directed to methods of forming a phase-change random access memory (PRAM) cell, and embodiments of phase-change random access memory (PRAM) cells. More particularly, embodiments of the invention are related to methods of forming a quadri-cell of phase-change random access memory (PRAM), and embodiments of quadri-cells of phase-change random access memory (PRAM).

For example, an exemplary embodiment is directed to a phase-change random access memory (PRAM) cell. The PRAM cell can comprise a bottom electrode, a heater resistor coupled to the bottom electrode, a phase change material (PCM) coupled to the heater resistor, and a top electrode coupled to the phase change material (PCM). An active region between the heater resistor and the phase change material (PCM) is defined by a thickness of the heater resistor.

Another embodiment is directed to a phase-change random access memory (PRAM) arrangement. The PRAM arrangement can comprise a plurality of phase-change random access memory (PRAM) cells. Each of the PRAM cells includes a bottom electrode, and a heater resistor coupled to the bottom electrode. The PRAM arrangement can further comprise a common phase change material (PCM) coupled to the heater resistor of each of the plurality of PRAM cells, and a top electrode coupled to Yet another embodiment is directed to a method of forming a phase-change random access memory (PRAM) cell. The method can comprise forming a bottom electrode, forming a heater resistor coupled to the bottom electrode, forming a phase change material (PCM) coupled to the heater resistor, and forming a top electrode coupled to the phase change material (PCM). An active region between the heater resistor and the phase change material (PCM) is defined by a thickness of the heater resistor.

Another embodiment is directed to a method of forming a phase-change random access memory (PRAM) arrangement. The method can comprise forming a plurality of phase-change random access memory (PRAM) cells. Each of the PRAM cells includes a bottom electrode, and a heater resistor coupled to the bottom electrode. The method further includes forming a common phase change material (PCM) coupled to the heater resistor of each of the plurality of PRAM cells, and forming a top electrode coupled to the common phase change material. An active region between the heater resistor of each of the plurality of PRAM cells and the phase change material is defined by a thickness of the heater resistor.

Another embodiment is directed to a phase-change random access memory (PRAM) cell, comprising a resistive means for generating heat, and a phase change means for allowing phase change coupled to the resistive means, wherein an active region between the resistive means and the phase change means is defined by a thickness of the resistive means.

Another embodiment is directed to a method of forming a phase-change random access memory (PRAM) cell. The method comprises step for forming a heater resistor, and step for forming a phase change material (PCM) coupled to the heater resistor, wherein an active region between the heater resistor and the phase change material (PCM) is defined by a thickness of the heater resistor.

BRIEF DESCRIPTION OF THE DRAWINGS

The accompanying drawings are presented to aid in the description of embodiments and are provided solely for illustration of the embodiments and not limitation thereof.

DETAILED DESCRIPTION

Figure 1:
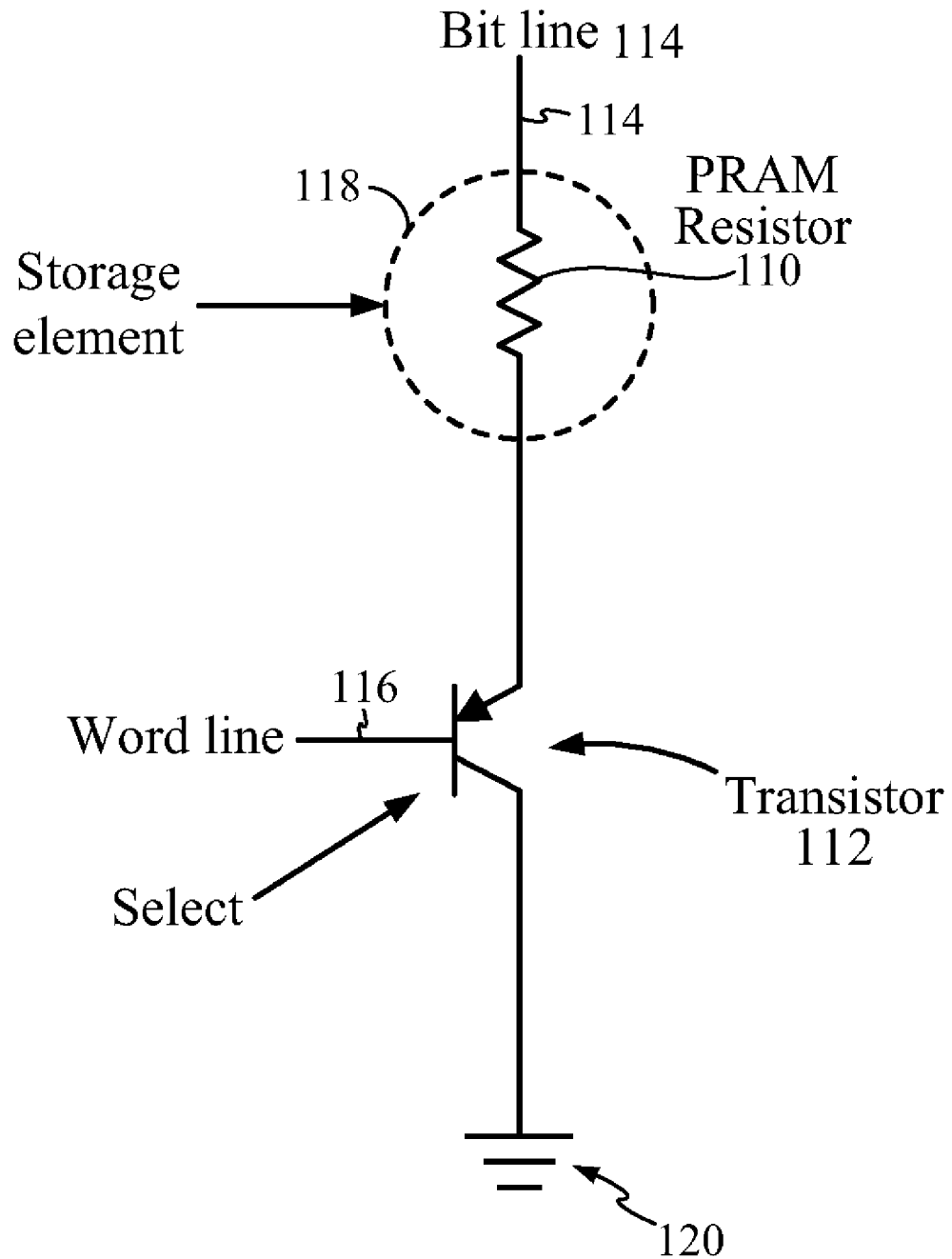
FIG. 1 is a schematic of a conventional PRAM cell.
Figure 2:
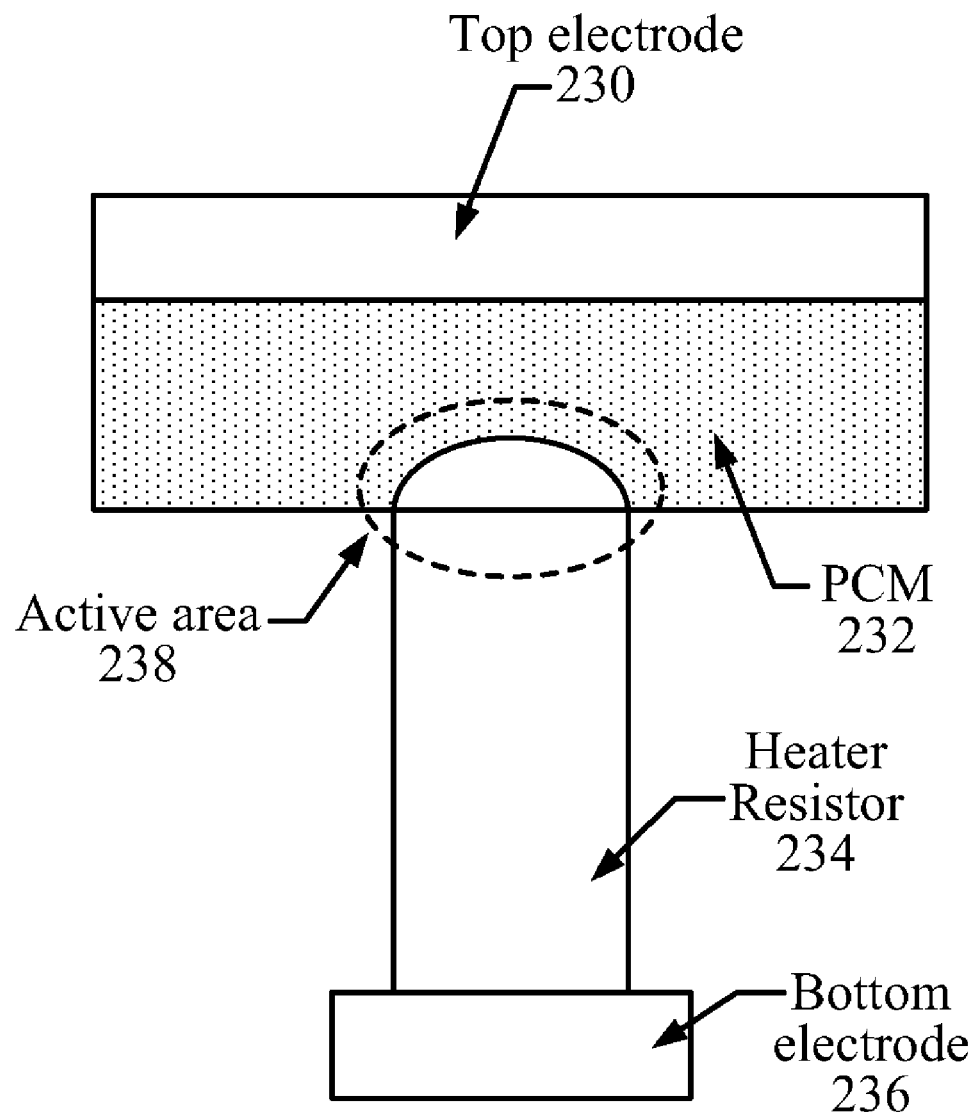
FIG. 2 is a cross-sectional view of a conventional PRAM resistor structure.
Figure 3A:
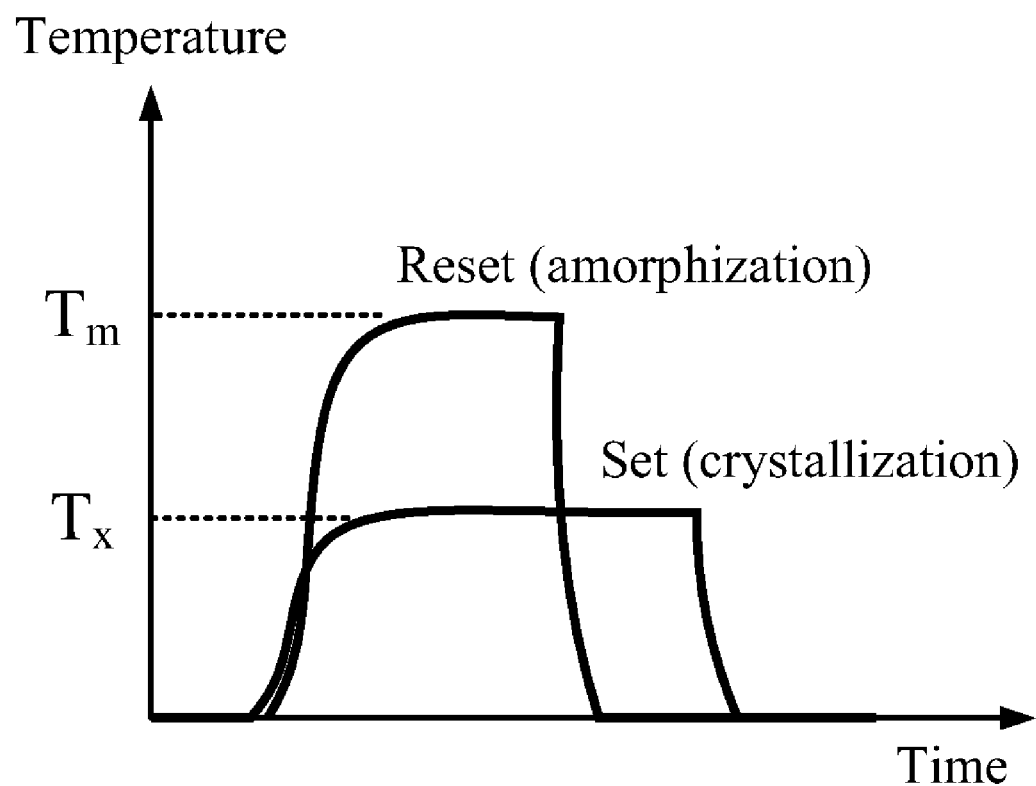
FIG. 3A is a graph showing exemplary temperature curves for phase change of a conventional PRAM resistor.
Figure 3B:
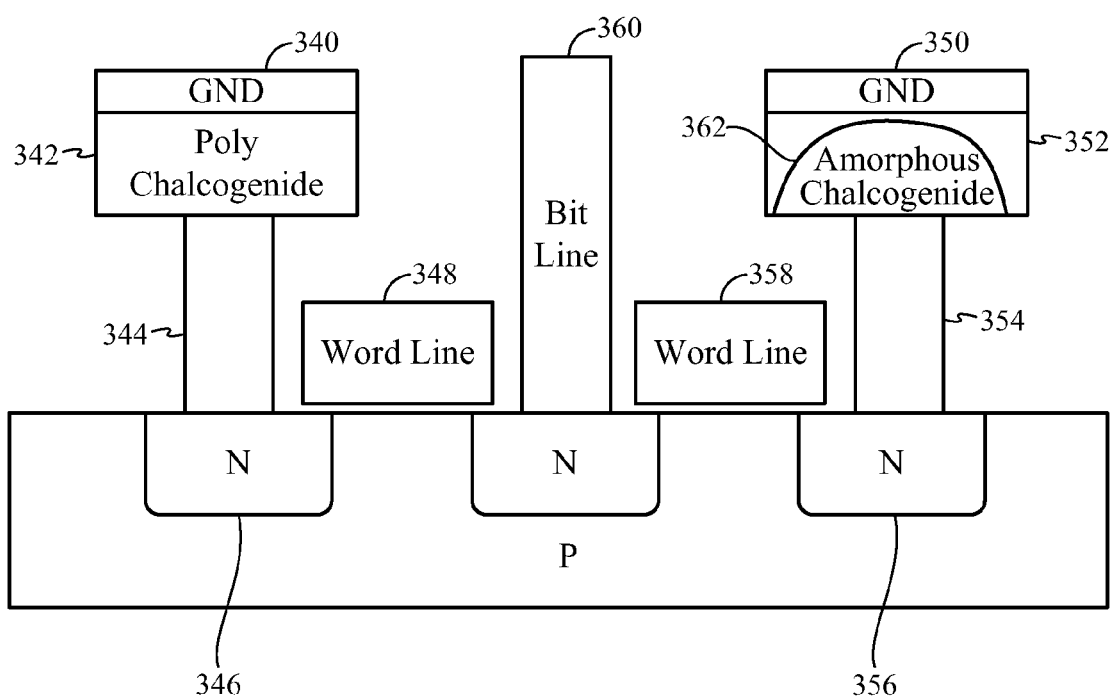
FIG. 3B is a cross-sectional view of a pair of conventional PRAM cells.

Aspects of the embodiments are disclosed in the following description and related drawings directed to such embodiments. Alternate embodiments may be devised without departing from the scope of the invention. Additionally, well-known elements used and applied in the embodiments will not be described in detail or will be omitted so as not to obscure the relevant details.

The word "exemplary" is used herein to mean "serving as an example, instance, or illustration." Any embodiment described herein as "exemplary" is not necessarily to be construed as preferred or advantageous over other embodiments. Likewise, the term "embodiments" does not require that all embodiments include the discussed feature, advantage or mode of operation.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

Exemplary embodiments are directed to methods of forming a phase-change random access memory (PRAM) cell, and embodiments of phase-change random access memory (PRAM) cells. More particularly, embodiments are related to methods of forming a quadri-cell of phase-change random access memory (PRAM), and embodiments of quadri-cells of phase-change random access memory (PRAM).

An aspect of providing high density phase-change random access memory (PRAM) integration is reducing the active area to reduce the writing current. Because of limitations associated with the photo/etch process window, the size of the phase change material (PCM) contact area generally is limited by design rule. In order to overcome this technology photo/etch limitation of the conventional devices and methods, the embodiments provide a novel shallow trench type PCM structure, and method of forming the same, that can reduce the size of the contact area beyond the conventional design rule and reduce the current needed to program the PRAM cell.

By sharing a top electrode and/or a phase change material (PCM), the embodiments provide an advantage of reducing PRAM cell size. The embodiments provide an advantage over the conventional methods and devices by using shallow trench and heater resistor film thickness to control the PCM contact window size (e.g., active region). Additionally, the top cap film allows more of the PCM film to fill in, which can reduce bulk resistance of the PCM, and which can isolate the top electrode from heater resistor.

According to the disclosed embodiments, the size of the contact window between PCM and heater resistor film can be reduced by thinning or reducing the heater resistor film thickness as compared to the size provided by the conventional design rules. That is, the embodiments of the heater resistor film thickness are not limited or constrained in vertical contact size by the conventional design rule. Accordingly, the size of the overall phase change resistor can be reduced and less current is needed to program the PRAM cell because of the reduced size of the active area, as well as the diamond-shaped PCM film layout for four bits. By sharing the switching device and multiplying the number of bits, the embodiments can improve or increase the bitcell density. Furthermore, in contrast to the conventional PRAM cells, which use a bipolar junction transistor (BTJ) device to program the phase-change random access memory (PRAM) cell, the embodiments can provide a metal oxide semiconductor (MOS) device to program the phase-change random access memory (PRAM) cell without increasing the PRAM cell size.

Figure 4:
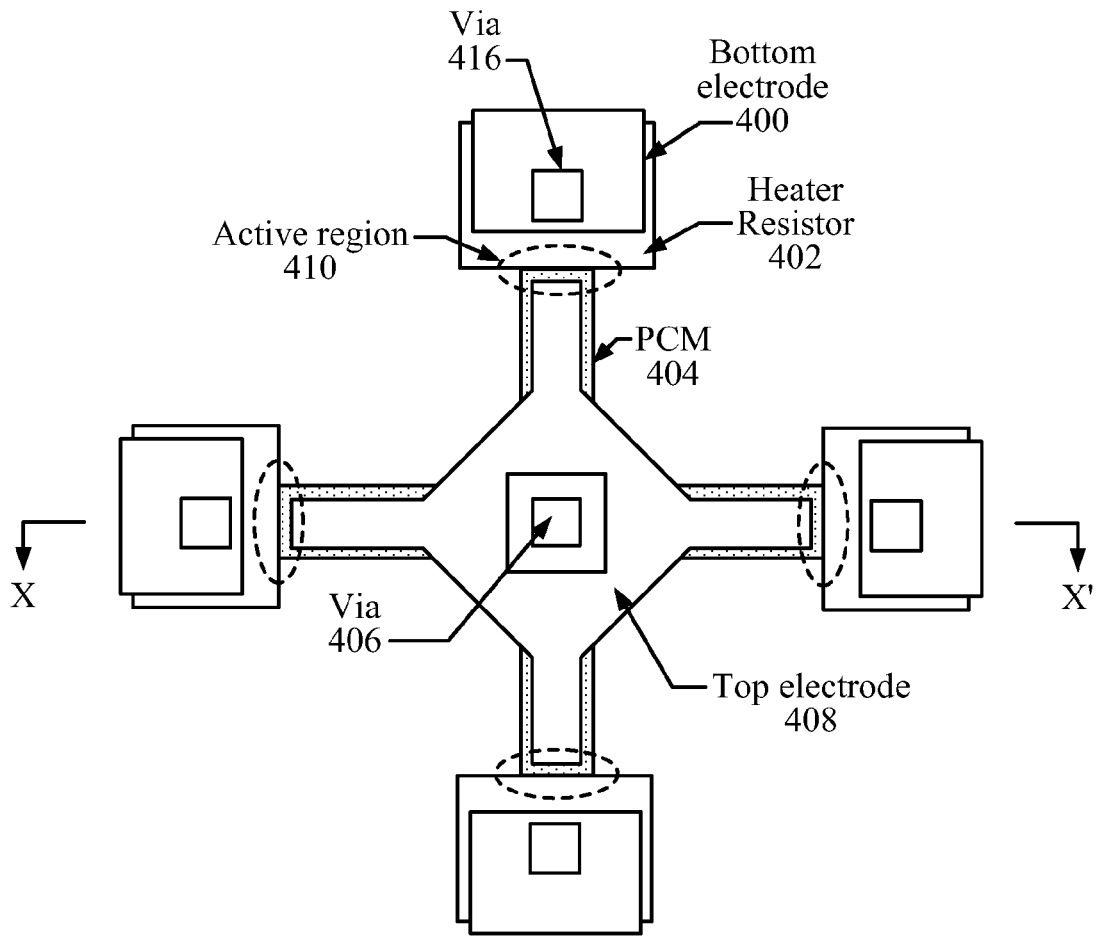
FIG. 4 is a top view of a PRAM quad-cell.
Figure 5:
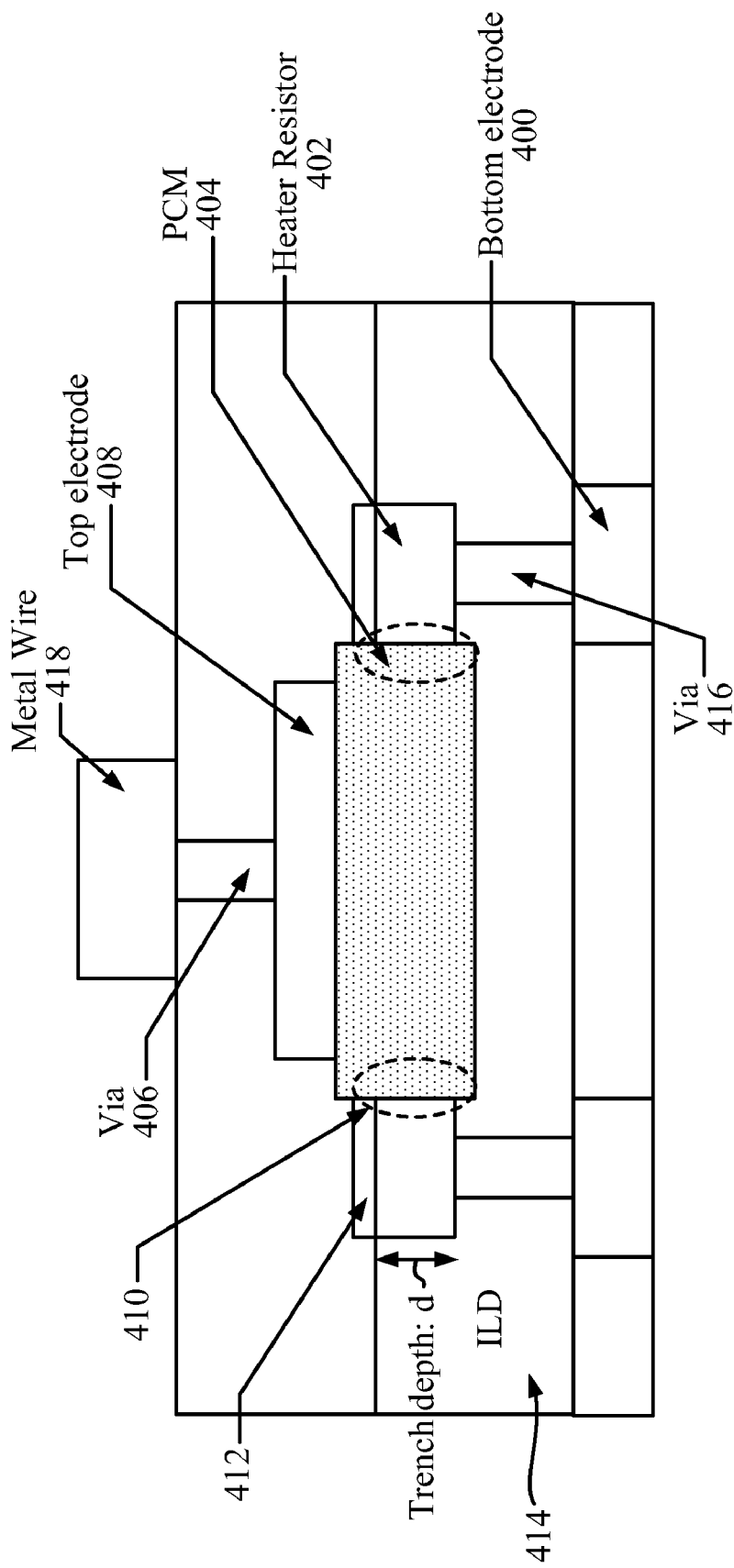
FIG. 5 is a cross-sectional view of the PRAM quad-cell illustrated in FIG. 4.

With reference to FIGS. 4 and 5, an exemplary embodiment of a shallow trench type quadri-cell for providing high density PRAM integration will now be described.

As shown in FIGS. 4 and 5, each of the PRAM cells includes a bottom electrode 400 that is coupled to a heater resistor 402 by a via 416. A cap film 412 is formed over each heater resistor 402. The quadri-cell structure includes a phase change material (PCM) 404 that is shared by each of the four PRAM cells. The quadri-cell structure also includes a top electrode 408 that is shared by four PRAM cells. The top electrode 408 can be coupled to the metal wire 418 by a via 406. By providing a shared top electrode 408 and shared PCM 404, the size of each of the PRAM cells can be reduced. As shown in the embodiment of FIG. 4, the PCM 404 and/or the top electrode 408 can be provided with a diamond-shape layout. The PCM 404 and/or the top electrode 408 can include a diamond-shaped central portion having leg portions that radiate or extend from the central portion to each of the individual PRAM cells. By providing, for example, a diamond-shaped layout of the PCM 404 and/or the top electrode 408, the size of each of the PRAM cells can be reduced, and the density of the PRAM cell arrangement can be increased. The ordinarily skilled artisan will recognize that the embodiments are not limited to a diamond-shaped layout and other arrangements and shapes clearly are contemplated by the embodiments.

An aspect of the PRAM cell arrangement is that the trench depth d, which is formed in the interlayer dielectric (ILD) 414, controlled by the thickness of the heater resistor 402 (e.g., heater resistor film). In an alternative embodiment, the thickness of the heater resistor 402 can be controlled by the deposition of the heater metal film followed by patterning of the heater metal film to form the heater resistor 402. The thickness of the heater resistor 402 controls the PCM contact window size, which is shown by the active region 410 between the heater resistor 402 and the PCM 404. The shallow trench is formed by a photo/etching process using the cap film 412 or heater resistor 402 metal film as a hardmask for providing self-alignment to a sidewall of the heater resistor 402. The PCM 404 is deposited into the trench and any extra PCM film on top of the cap film 412 surface or heater resistor 402 surface is removed by a chemical mechanization planarization (CMP) process.

In an embodiment, the PCM film can be deposited to a thickness such that the top surface of the resulting PCM 404 is above a top surface of the heater resistor 402. The PCM 404 also can be formed such that the top surface of the PCM 404 is level with or above a top surface of the cap film 412. The CMP process or etching process of the PCM 404 is performed at a distance (e.g., a minimum distance) from the PCM active area. This predetermined distance (e.g., minimum distance) can prevent or reduce an impact of the CMP/etching process on the PCM active region. The cap film 412 formed over the heater resistor 402 allows more PCM film to fill in, which can reduce the bulk resistance of the PCM 404, and which provides an advantage of isolating the top electrode 408 from the heater resistor 402.

As shown in FIG. 5, the heater resistor 402 is deposited and patterned such that the thickness of the heater resistor 402 corresponds to the trench depth d. According to the embodiment, the contact height of the heater resistor 402 and the PCM 404 contact area can be easily controlled based on the thickness (i.e., trench depth d) of the heater resistor 402. By thinning or reducing the thickness of the heater resistor 402, the size of the contact window (i.e., active region 410) between the heater resistor 402 and the PCM 404 can be reduced compared to the size of the contact window using the conventional design rule. Accordingly, the overall size of the phase change resistor can be reduced. The current needed to program the PRAM cell can be reduced as a result of the smaller active area and diamond PCM film layout. According to another embodiment, a Metal Oxide Semiconductor (MOS) device may be used instead of a bipolar junction transistor (BJT) device to program the PRAM cell without increasing the cell size.

In an embodiment, the heater resistor 402 can be formed using a higher resistivity metal to generate a Joule effect while the writing occurs. One of ordinary skill in the art will recognize that the sidewall of the heater resistor 402 can be formed from other materials. Other materials are contemplated by the embodiments and the material of the PCM 404 is not limited to a compound of group VI chalcogenic elements S, Se, Te with group IV and V elements.

According to the embodiment, the thickness (i.e., vertical dimension) of the film used to form the heater resistor 402 can be used to control the contact window size (contact area 410) between the heater resistor 402 and the PCM 404. Therefore, the disclosed embodiment is not constrained by the limitations associated with the conventional photo/etch process window in the vertical direction, and the size of the phase change material (PCM) contact area is not limited by design rule. Hence, the disclosed embodiments can reduce the size of the contact area beyond the conventional design rule and reduce the current needed to program the PRAM cell.

Figure 6:
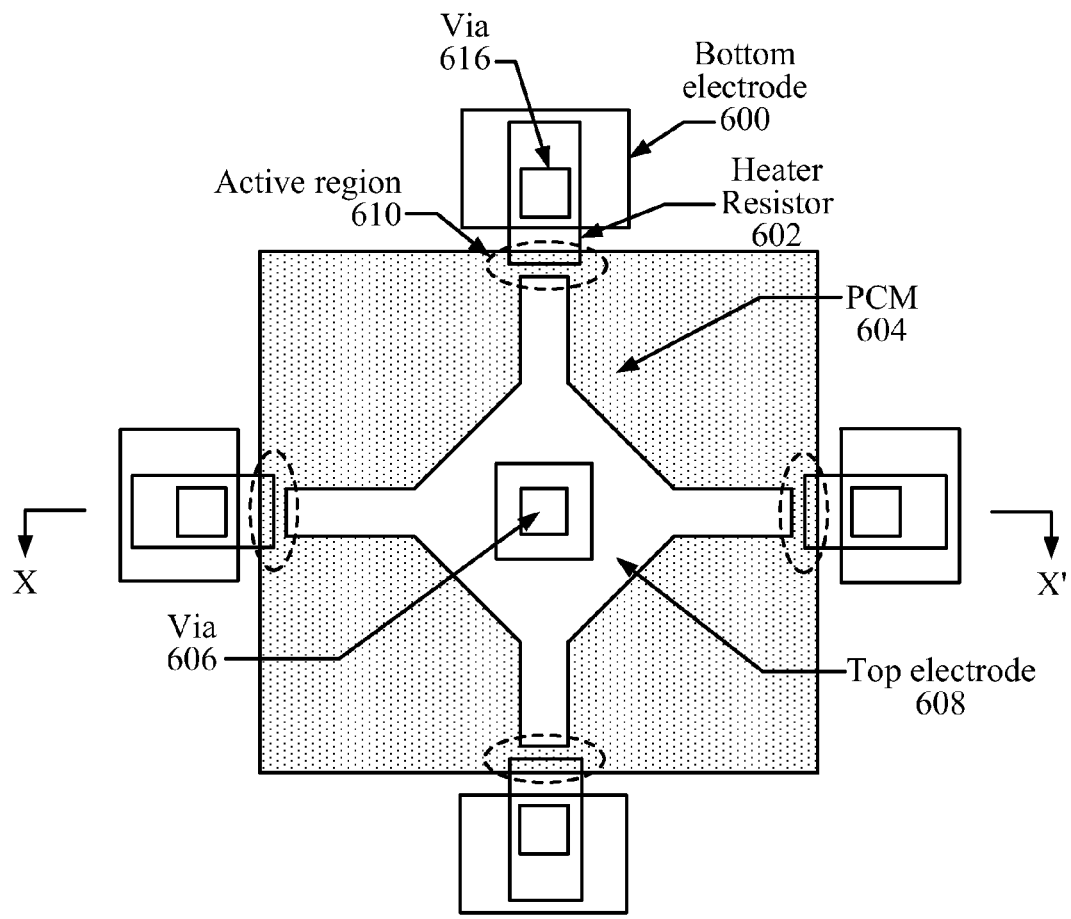
FIG. 6 is a top view of a PRAM quad-cell.
Figure 7:
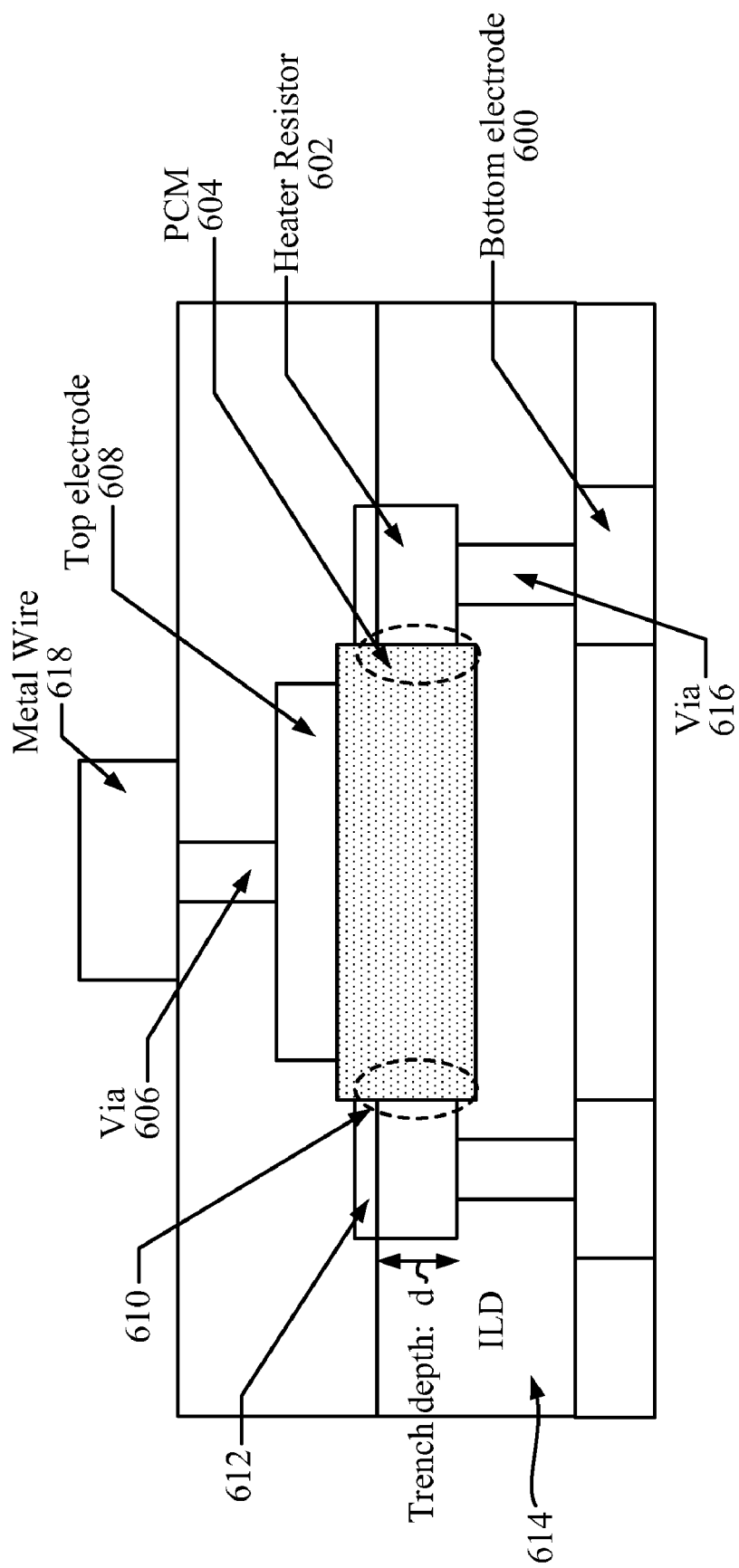
FIG. 7 is a cross-sectional view of the PRAM quad-cell illustrated in FIG. 6.
Figure 8:
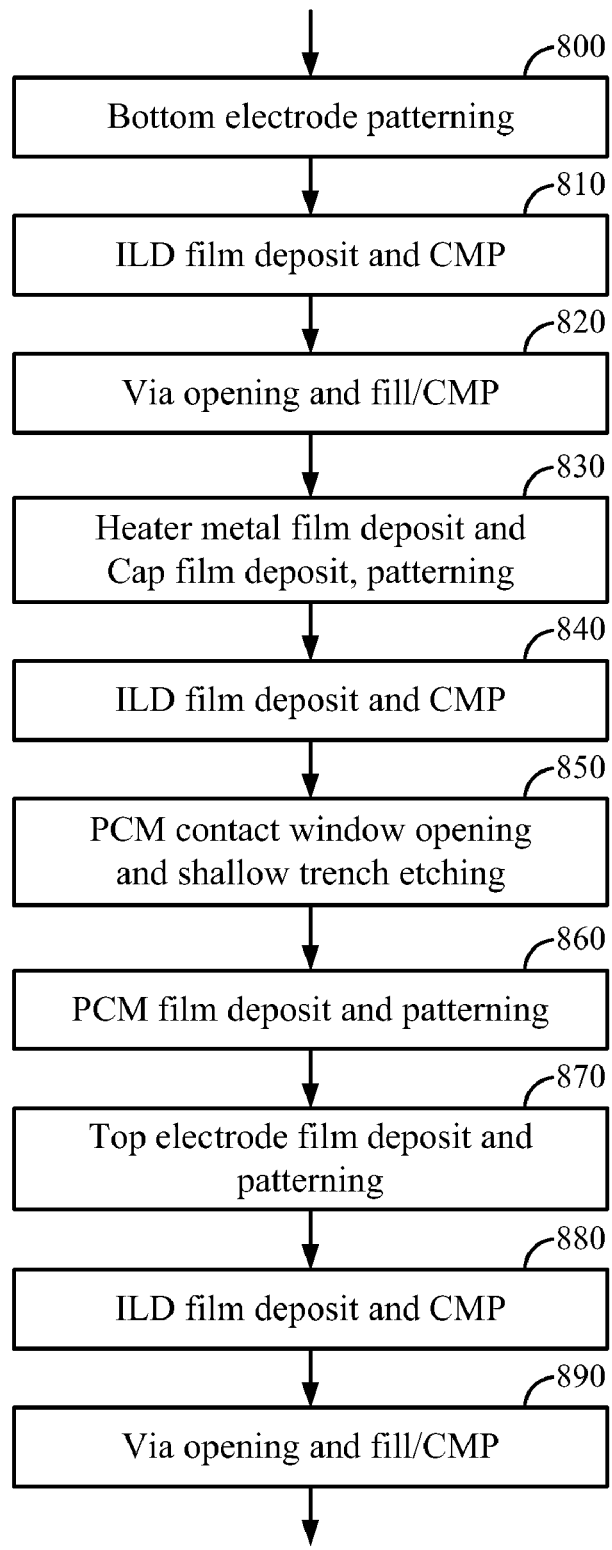
FIG. 8 is a flow diagram illustrating a method of forming a PRAM quad-cell.

With reference to FIGS. 6 and 7, another exemplary embodiment of a shallow trench type quadri-cell for providing high density PRAM integration will now be described.

As shown in FIGS. 6 and 7, each of the PRAM cells includes a bottom electrode 600 that is coupled to a heater resistor 602 by a via 616. A cap film 612 is formed over each heater resistor 602. The quadri-cell structure includes a phase change material (PCM) 604 that is shared by each of the four PRAM cells. The quadri-cell structure also includes a top electrode 608 that is shared by four PRAM cells. The top electrode 608 can be coupled to the metal wire 618 by a via 606. By providing a shared top electrode 608 and shared PCM 604, the size of each of the PRAM cells can be reduced. As shown in the embodiment of FIG. 6, the top electrode 608 can be provided with a diamond-shape layout. The top electrode 608 can include a diamond-shaped central portion having leg portions that radiate or extend from the central portion to each of the individual PRAM cells. By providing, for example, a diamond-shaped layout of the top electrode 608, the size of each of the PRAM cells can be reduced, and the density of the PRAM cell arrangement can be increased. The ordinarily skilled artisan will recognize that the embodiments are not limited to a diamond-shaped layout and other arrangements and shapes clearly are contemplated by the embodiments.

The PCM 604 can be provided, for example, with a simple rectangular or square shape. Other shapes also are contemplated by the embodiments.

An aspect of the PRAM cell arrangement is that the trench depth d, which is formed in the interlayer dielectric (ILD) 614, is controlled by the thickness of the heater resistor 602 (e.g., heater resistor film). In an alternative embodiment, the thickness of the heater resistor 602 can be controlled by the deposition of the heater metal film followed by patterning of the heater metal film to form the heater resistor 602. The thickness of the heater resistor 602 controls the PCM contact window size, which is shown by the active region 610 between the heater resistor 602 and the PCM 604. The shallow trench is formed by a photo/etching process using cap/heater resistor metal film as a hardmask for self-alignment to the sidewall of the heater resistor 602. The PCM 604 is deposited into the trench and any extra PCM film on top of the cap film 612 surface or the heater resistor 602 surface is removed by performing a chemical mechanization planarization (CMP) process. The CMP process or etching process of the PCM 604 is performed at a distance (e.g., a minimum distance) from the PCM active area. The distance (e.g., minimum distance) can prevent or reduce an impact of the CMP/etching process on the PCM active region. The cap film 612 formed over the heater resistor 602 allows more PCM film to fill in, which can reduce the bulk resistance of the PCM 604, and which provides an advantage of isolating the top electrode 608 from the heater resistor 602.

As shown in FIG. 7, the heater resistor 602 is deposited/patterned and thickness of the heater resistor 602 corresponds to the trench depth d. According to the embodiment, the contact height of the heater resistor 602 and the PCM 604 can be easily controlled based on the thickness (i.e., trench depth d) of the heater resistor 602. By thinning or reducing the thickness of the heater resistor 602, the size of the contact window (i.e., active region 610) between the heater resistor 602 and the PCM 604 can be reduced compared to the size of the contact window using the conventional design rule. Accordingly, the overall size of the phase change resistor can be reduced. The current needed to program the PRAM cell can be reduced as a result of the smaller active area and diamond PCM film layout. According to another embodiment, a Metal Oxide Semiconductor (MOS) device may be used instead of a bipolar junction transistor (BJT) device to program the PRAM cell without increasing the cell size.

In an embodiment, the heater resistor 602 can be formed using a higher resistivity metal to generate a Joule effect while the writing occurs. One of ordinary skill in the art will recognize that the heater resistor 602 can be formed from materials sidewall. Other materials are contemplated by the present invention and the material of the PCM 604 is not limited to a compound of group VI chalcogenic elements S, Se, Te with group IV and V elements.

According to the embodiment, the thickness (i.e., vertical dimension) of the film used to form the heater resistor 602 can be used to control the contact window size (contact area 610) between the heater resistor 602 and the PCM 604. Therefore, the embodiments are not constrained by the limitations associated with the photo/etch process window in vertical direction, and the size of the phase change material (PCM) contact area is not limited by design rule. Hence, the embodiments can reduce the size of the contact area beyond the conventional design rule and reduce the current needed to program the PRAM cell.

An exemplary method of forming a PRAM cell arrangement will now be described with reference to FIGS. 8, 9A-9H, and 10. One of ordinary skill will recognize that the exemplary methods can be used to form a single PRAM cell or a plurality of PRAM cells, including, for example, a quadri-cell of PRAM.

Figure 9A:
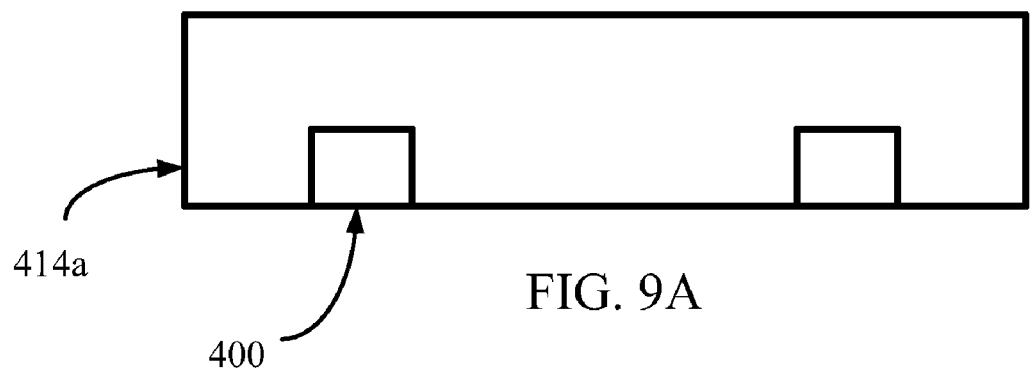
FIGS. 9A-9H show cross-sectional views of a method of forming a PRAM quad-cell during various stages of formation.
Figure 9B:
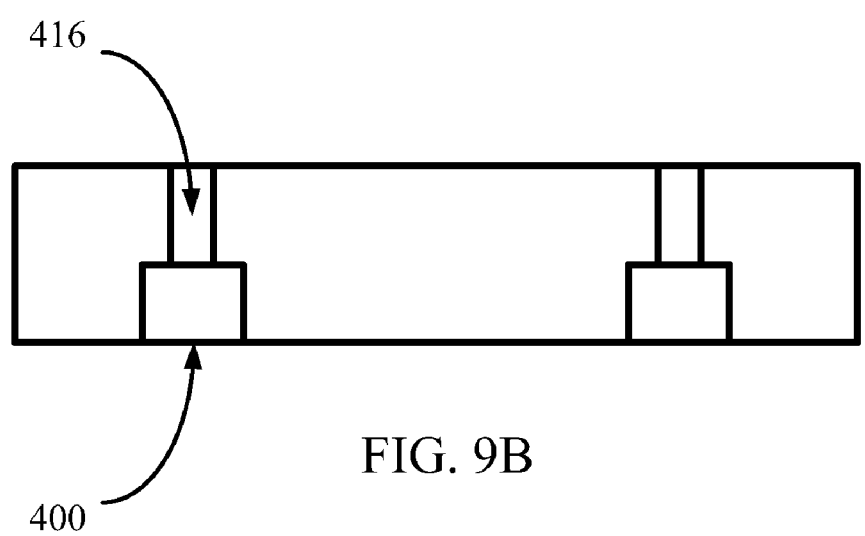

As shown in FIG. 9A, an embodiment of the method includes patterning the bottom electrodes 400 (800). A first interlayer dielectric (ILD) film 414a is deposited over the bottom electrodes 400, and a chemical mechanical polishing (CMP) process is performed (810). A via opening is etched in the first ILD 414a and filled with metal to form a first via interconnect 416, followed by a CMP process of the via interconnect 416 and the first ILD 414a (820), as shown in FIG. 9B.

Figure 9C:
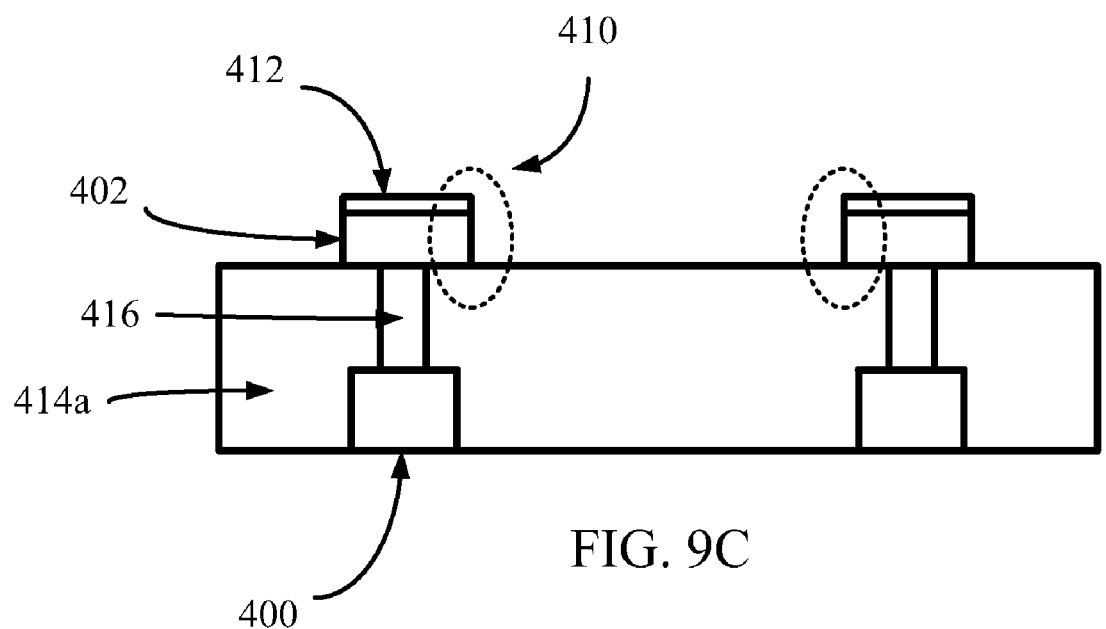
Figure 9D:
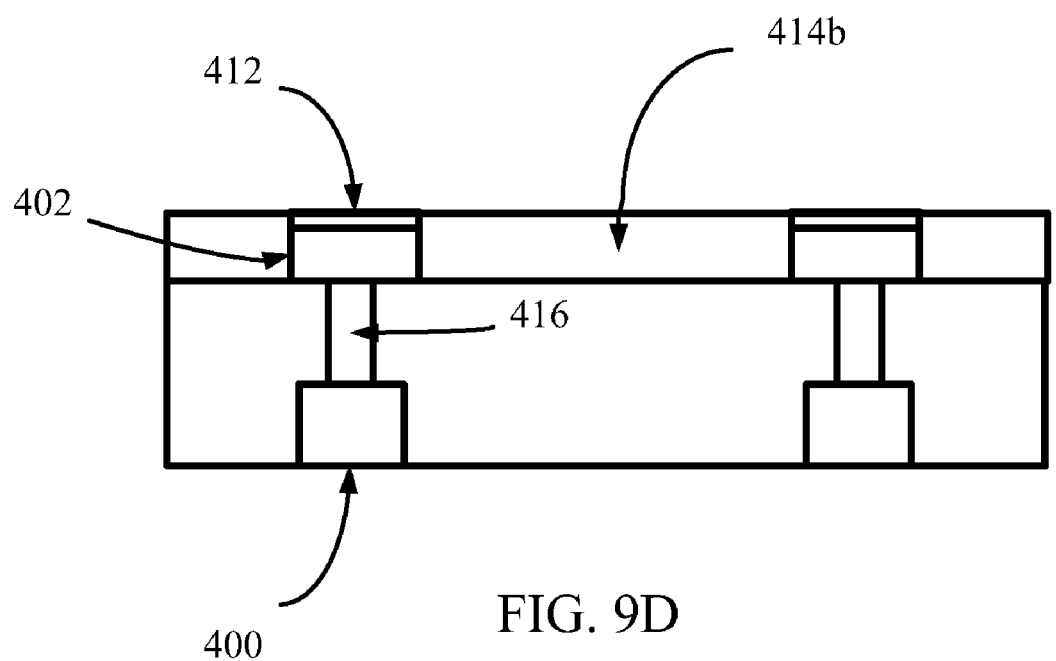

With reference to FIG. 9C, a heater metal film and cap film are deposited and pattered by a photo/etching process to form a heater resistor 402 and a cap film 412. In an embodiment, the thickness of the heater resistor 402 can be controlled by the deposition of the heater metal film followed by patterning of the heater metal film to form the heater resistor 402. For example, a cap film is deposited on the heater metal film. Then, the heater metal film and the cap film are patterned by a photo/etching process to form the heater resistor 402 and cap film 412 (830). The trench depth d of the sidewall of the heater resistor 402 is controlled by the thickness of the heater metal film, which provides an advantage of controlling the active region between the resulting heater resistor 402 and the phase change material 404 formed in a subsequent step. The PCM active area is at a predetermined distance (e.g., a predetermined minimum distance) from the area of the PCM 404 that is subjected to the CMP process or etching. The distance can prevent or reduce the impact on the PCM active region from the CMP process or etching process. A second ILD 414b is deposited over the cap film 412 and the heater resistor 402 and a CMP process is performed (840), as shown in FIG. 9D.

Figure 9E:
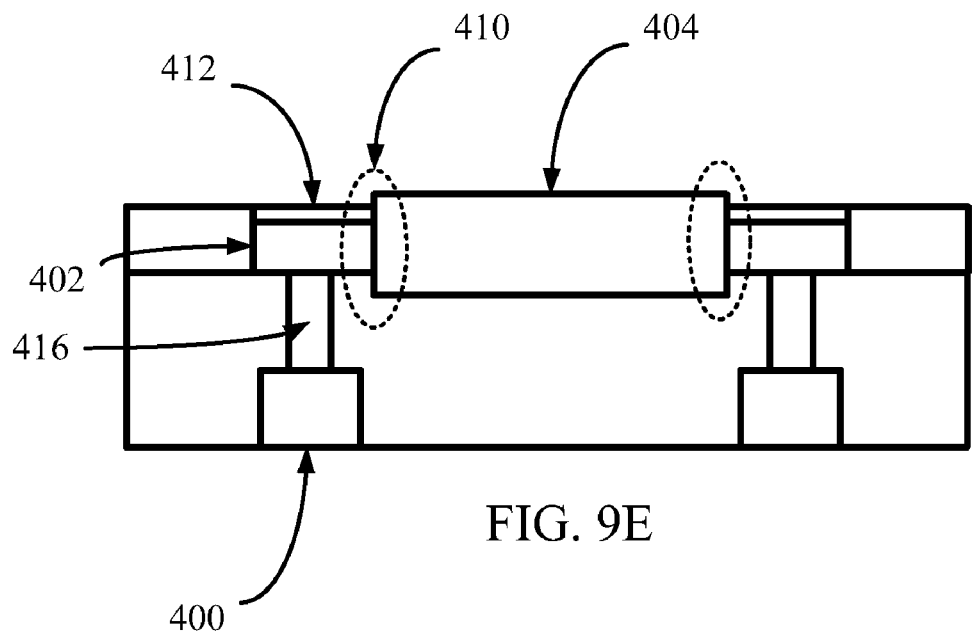

Next, a phase change material contact window opening is formed by shallow trench etching (850) and the PCM film is deposited and patterned to form the PCM 404 using a CMP process or a photo/etching process (860), as shown in FIG. 9E.

In an embodiment, the PCM film can be deposited to a thickness such that the top surface of the resulting PCM 404 is above a top surface of the heater resistor 402. The PCM 404 also can be formed such that the top surface of the PCM 404 is level with or above a top surface of the cap film 412. As explained above, the PCM active area can be arranged at a predetermined distance (e.g., a predetermined minimum distance) from the area of the PCM 404 that is subjected to the CMP process or etching. This distance can prevent or reduce the impact on the PCM active region from the CMP process or etching process.

Figure 9F:
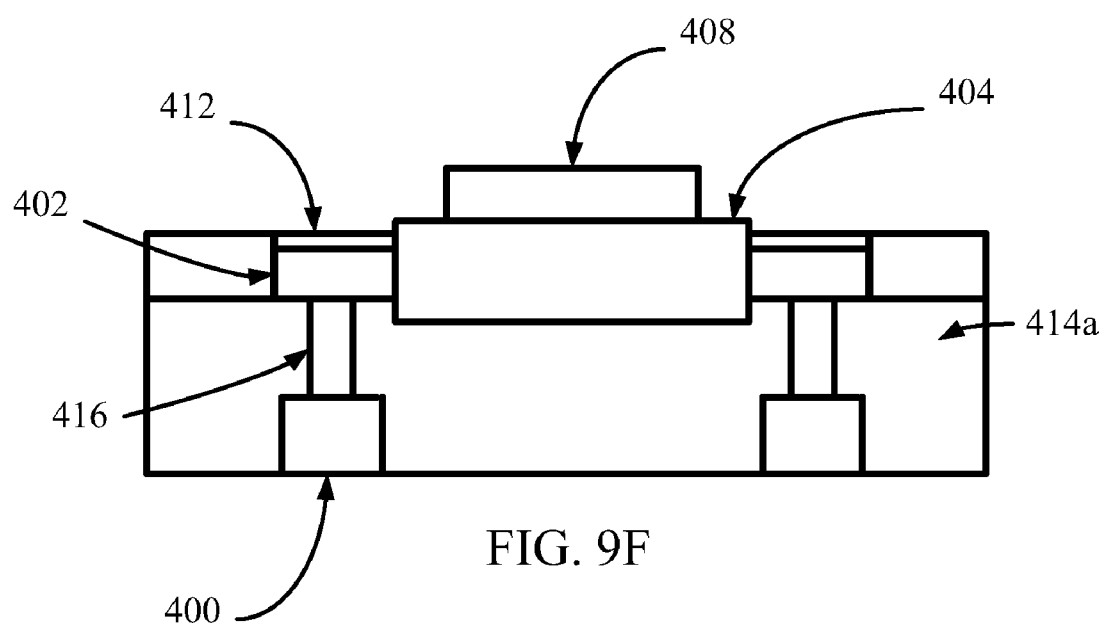
Figure 9G:
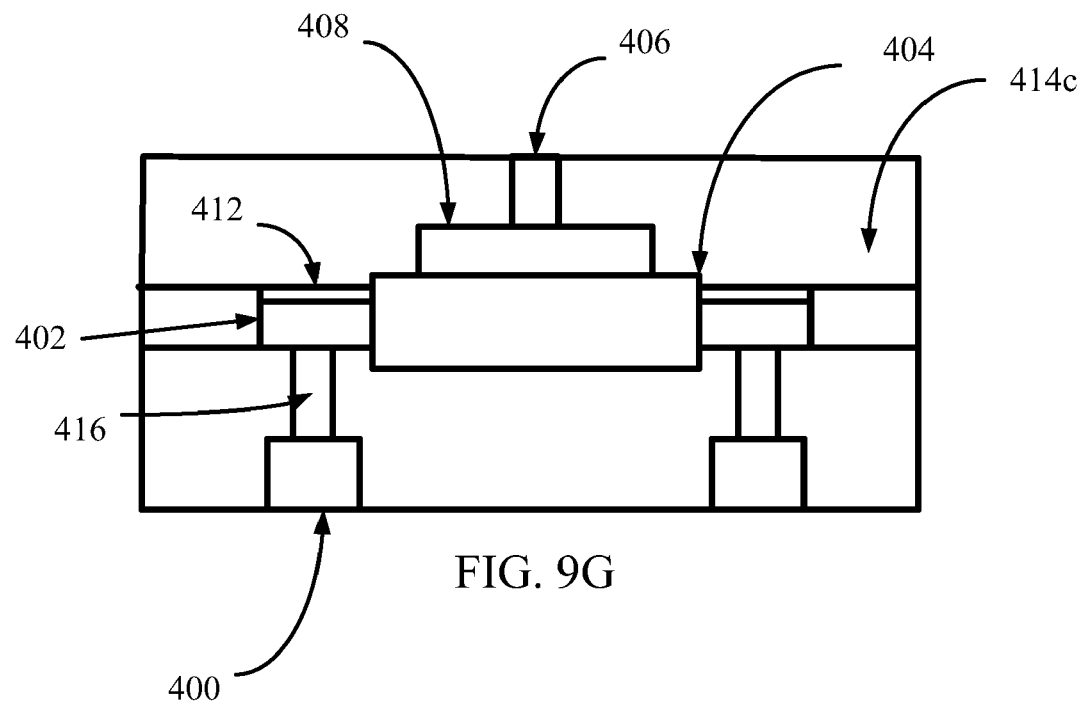
Figure 9H:
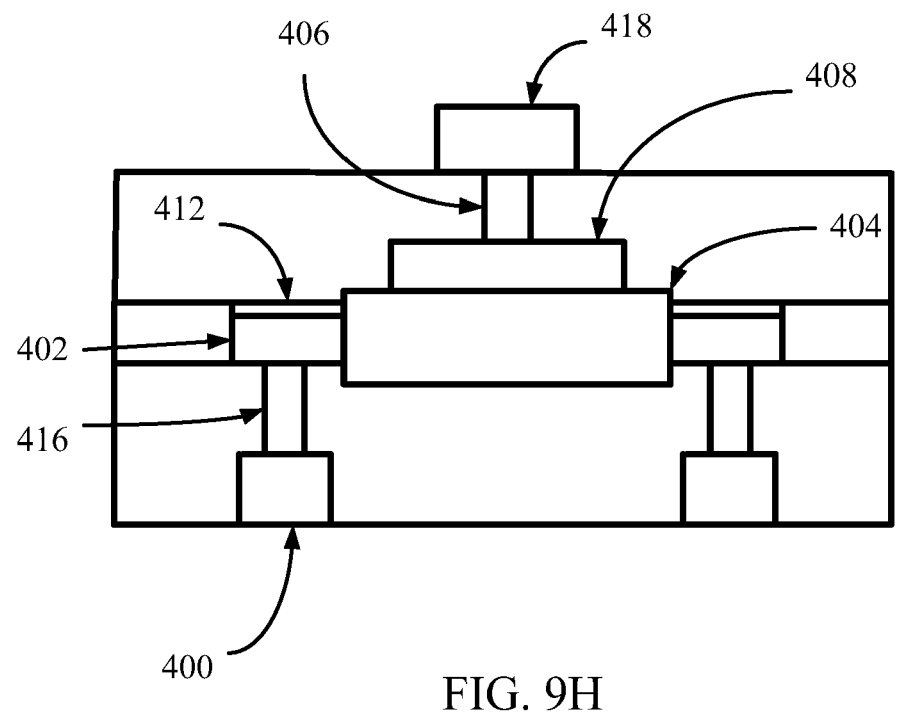

The top electrode film is deposited and patterned to form the top electrode 408 (870), as shown in FIG. 9F. Next, a third ILD film 414c is deposited and a CMP process is performed (880). An opening is formed in the third ILD 414c down to the top electrode 408 and the opening is filled with metal to form the second via interconnect 406. The third ILD 414c and the second via interconnect 406 are subjected to a CMP process (890), as shown in FIG. 9G. A top metal wire 418 (e.g., bit line) can be coupled to the second via interconnect 406, as shown in FIG. 9H.

Figure 10:
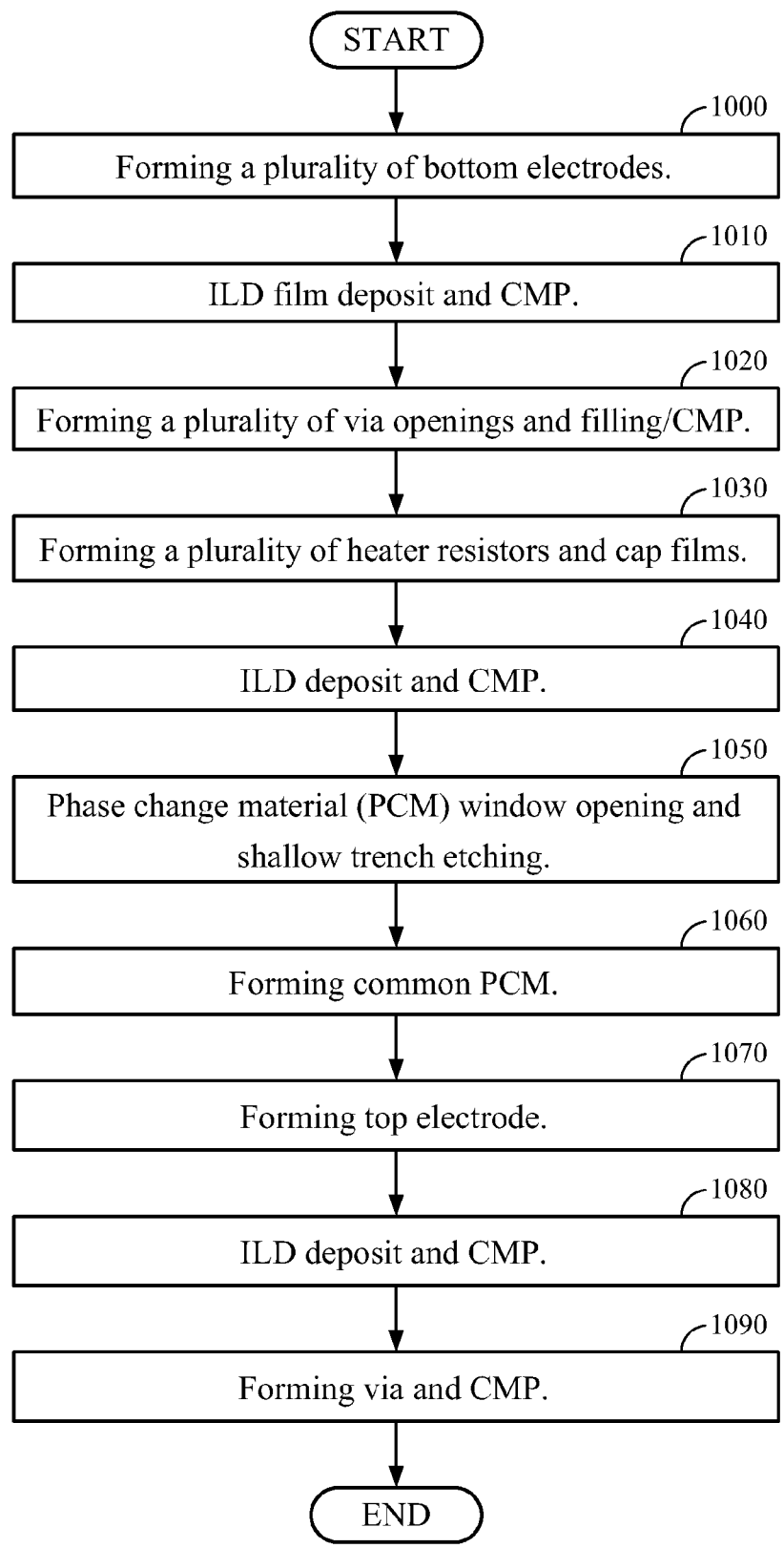
FIG. 10 is a flow diagram illustrating a method of forming a PRAM quad-cell.

With reference to FIG. 10, an embodiment of a method can include forming a plurality of bottom electrodes (1000) and depositing an interlayer dielectric, followed by chemical mechanical polishing (CMP) (1010). The method can include forming a plurality of via openings and filling the opening with metal to form a plurality of via interconnects, followed by a CMP process (1020). Next, a plurality of heater resistors with cap films are formed (1030). An ILD is deposited, followed by a CMP process (1040). A phase change material (PCM) window opening is formed using shallow trench etching (1050) and the phase change material is deposited to form a common PCM for each of the plurality of heater resistors (1060). Next, a top electrode is formed over the PCM (1070). An ILD is deposited and a CMP process is performed (1080). Finally, a via interconnect is formed in the ILD and coupled to the top electrode, followed by a CMP process (1090). A top metal wire (e.g., bit line) is coupled to the via interconnect.

It will be appreciated that the PRAM cells and PRAM cell arrangements illustrated for example in FIGS. 4 and 6 may be included within a mobile phone, portable computer, handheld personal communication system (PCS) unit, portable data units such as personal data assistants (PDAs), GPS enabled devices, navigation devices, settop boxes, music players, video players, entertainment units, fixed location data units such as meter reading equipment, or any other device that stores or retrieves data or computer instructions, or any combination thereof. Accordingly, embodiments of the disclosure may be suitably employed in any device which includes active integrated circuitry including memory and on-chip circuitry for test and characterization.

The foregoing disclosed devices and methods are typically designed and are configured into GDSII and GERBER computer files, stored on a computer readable media. These files are in turn provided to fabrication handlers who fabricate devices based on these files. The resulting products are semiconductor wafers that are then cut into semiconductor die and packaged into a semiconductor chip. The chips are then employed in devices described above.

Those of skill in the art will appreciate that the disclosed embodiments are not limited to illustrated examples and any means for performing the functionality described herein are included in the embodiments.

While the foregoing disclosure shows illustrative embodiments, it should be noted that various changes and modifications could be made herein without departing from the scope of the invention as defined by the appended claims. The functions, steps and/or actions of the method claims in accordance with the embodiments described herein need not be performed in any particular order. Furthermore, although elements of the embodiments may be described or claimed in the singular, the plural is contemplated unless limitation to the singular is explicitly stated.

What is claimed is:

1. A phase-change random access memory (PRAM) cell, comprising:
    a heater resistor;
    a phase change material (PCM) coupled to the heater resistor;
    a top electrode coupled to the phase change material (PCM); and
    a second via interconnect coupled to the top electrode, the second via, interconnect having an axis;
wherein the heater resistor is radially disposed with respect to the axis of the second via interconnect and wherein an active region between the heater resistor and the phase change material (PCM) is defined by a thickness of the heater resistor.

2. The PRAM cell according to claim 1, further comprising:
    a bottom electrode, wherein the heater resistor is coupled to the bottom electrode.

3. The PRAM cell according to claim 2, wherein the bottom electrode is coupled to the heater resistor by a first via interconnect.

4. The PRAM cell according to claim 1, further comprising:
    a top metal wire coupled to the top electrode.

5. The PRAM cell according to claim 4, wherein the top metal wire is coupled to the top electrode by the second via interconnect.

6. The PRAM cell according to claim 1, further comprising:
    a cap film formed over the heater resistor.

7. The PRAM cell according to claim 6, wherein a top surface of the phase change material (PCM) is level with or above a top surface of the cap film.

8. The PRAM cell according to claim 1, wherein a top surface of the phase change material (PCM) is above a top surface of the heater resistor.

9. The PRAM cell according to claim 1, wherein an active region of the phase change material is at a predetermined distance from a top surface of the phase change material (PCM).

10. The PRAM cell according to claim 1 integrated in east one semiconductor die.

11. The PRAM cell according to claim 1, wherein the PRAM cell is integrated in an electronic device selected from the group consisting of a set top box, music player, video player, entertainment unit, navigation device, communications device, personal digital assistant (PDA), fixed location data unit, and a computer.

12. A phase-change random access memory (PRAM) arrangement, comprising:
    a plurality of phase-change random access memory (PRAM) cells, wherein each of the PRAM cells includes:
    a heater resistor;
    a common phase change material (PCM) coupled to the heater resistor of each of the plurality of PRAM cells;
    a common top electrode coupled to the common phase change material (PCM); and
    a second via interconnect coupled to the common top electrode, the second via having axis;
wherein the heater resistor of each of the plurality of PRAM cells is radially disposed with respect to the axis of the second via interconnect and wherein an active region between the heater resistor of each of the plurality of PRAM cells and the common phase change material (PCM) is defined by a thickness of the heater resistor.

13. The PRAM arrangement according to claim 12, further comprising:
    a bottom electrode, wherein the heater resistor is coupled to the bottom electrode.

14. The PRAM arrangement according to claim 13, wherein the bottom, electrode is coupled to the heater resistor by a first via interconnect.

15. The PRAM arrangement according to claim 12, further comprising:
    a top metal wire coupled to the common top electrode.

16. The PRAM arrangement according to claim 15, wherein the top metal wire is coupled to the common top electrode by the second via interconnect.

17. The PRAM arrangement according to claim 13, wherein the common top electrode has a central portion and a plurality of portions extending from the central portion to the plurality of PRAM cells.

18. The PRAM arrangement according to claim 17, wherein the central portion of the common top electrode has a diamond-shape.

19. The PRAM arrangement according to claim 13, wherein the common top electrode has a rectangular-shaped layout or a square-shaped layout.

20. The PRAM arrangement according to claim 12, further comprising:
   a cap film formed over the heater resistor of each of the plurality of PRAM cells.

21. The PRAM arrangement according to claim 20, wherein a top surface of the common phase change material (PCM) is level with or above a top surface of the cap film of each of the plurality of PRAM cells.

22. The PRAM arrangement according to claim 12, wherein a top surface of the phase change material (PCM) is above a top surface of the heater resistor of each of the plurality of PRAM cells.

23. The PRAM arrangement according to claim 12, wherein an active region of the common phase change material (PCM) is at a predetermined distance from a top surface of the common phase change material (PCM).

24. The PRAM arrangement according to claim 12, wherein the common phase change material (PCM) has a central portion and a plurality of portions extending from the central portion to the plurality of PRAM cells.

25. The PRAM arrangement according to claim 24, wherein the central portion of the common phase change material (PCM) has a diamond-shape.

26. The PRAM arrangement according to claim 12, wherein the common phase change material (PCM) has a rectangular-shaped layout or square-shaped layout.

27. The PRAM arrangement of claim 12 integrated in at least one semiconductor die.

28. The PRAM arrangement of claim 12, wherein the PRAM arrangement is integrated in an electronic device selected from the group consisting of a set top box, music player, video player, entertainment unit, navigation device, communications device, personal digital assistant (PDA), fixed location data unit, and a computer.

29. A method of forming a phase-change random access memory (PRAM) cell, the method comprising:
   forming a heater resistor;
   forming a phase change material (PCM) coupled to the heater resistor;
   forming a top electrode coupled to the phase change material (PCM); and
   forming a second via interconnect coupled to the to electrode the second via interconnect having an axis;
   wherein the heater resistor is radially disposed with respect to the axis of the second via interconnect and wherein an active region between the heater resistor and the phase change material (PCM) is defined by a thickness of the heater resistor.

30. The method according to claim 29, further comprising:
   forming a bottom electrode, wherein the heater resistor is coupled to the bottom electrode.

31. The method according to claim 30, further comprising:
   forming a first via interconnect that couples the bottom electrode to the heater resistor.

32. The method according to claim 29, further comprising:
   forming a cap film over the heater resistor.

33. The method according to claim 32, wherein forming the phase change material (PCM) includes depositing the phase change material (PCM) at a predetermined thickness such that a top surface of the phase change material (PCM) is level with or above a top surface of the cap film.

34. The method according to claim 29, wherein forming the phase change material (PCM) includes depositing the phase change material (PCM) at a predetermined thickness such that a top surface of the phase change material (PCM) is above a top surface of the heater resistor.

35. The method according to claim 29, wherein an active region of the phase change material (PCM) is at a predetermined distance from a top surface of the phase change material (PCM).

36. The method according to claim 29, wherein the PRAM cell is applied in an electronic device, selected from the group consisting of a set top box, music player, video player, entertainment unit, navigation device, communications device, personal digital assistant (PDA), fixed location data unit, and a computer, into which the PRAM cell is integrated.

37. A method of forming a phase-change random access memory (PRAM) arrangement, the method comprising:
   forming a plurality of phase-change random access memory (PRAM) cells, wherein each of the PRAM cells includes a heater resistor;
   forming a common phase change material (PCM) coupled to the heater resistor of each of the plurality of PRAM cells;
   forming a top electrode coupled to the common phase change material (PCM); and
   forming a second via interconnect coupled to the to electrode the second via interconnect having an axis;
   wherein the heater resistor of each of the plurality of PRAM cells is radially disposed with respect to the axis of the second via interconnect and wherein an active region between the heater resistor of each of the plurality of PRAM cells and the phase change material is defined by a thickness of the heater resistor.

38. The method according to claim 37, wherein each of the PRAM cells further includes a bottom electrode, wherein the heater resistor of each of the PRAM cells is coupled to the respective bottom electrode.

39. The method according to claim 38, further comprising:
   forming a first via interconnect that couples the respective bottom electrode to the heater resistor.

40. The method according to claim 37, wherein the top electrode has a central portion and a plurality of portions extending from the central portion to the plurality of PRAM cells.

41. The method according to claim 40, wherein the central portion of the top electrode has a diamond-shape.

42. The method according to claim 37, wherein the top electrode has a rectangular-shaped layout or a square-shaped layout.

43. The method according to claim 37, further comprising:
   forming a cap film over the heater resistor of each of the plurality of PRAM cells.

44. The method according to claim 43, wherein forming the common phase change material (PCM) includes depositing the common phase change material (PCM) at a predetermined thickness such that a top surface of the common phase change material (PCM) is level with or above a top surface of the cap film of each of the plurality of PRAM cells.

45. The method according to claim 37, wherein forming the common phase change material (PCM) includes depositing the common phase change material (PCM) at a predetermined thickness such that a top surface of the common phase change material (PCM) is above a top surface of the heater resistor of each of the plurality of PRAM cells.

46. The method according to claim 37, wherein an active region of the common phase change material (PCM) is at a predetermined distance from a top surface of the common phase change material (PCM).

47. The method according to claim 37, wherein the common phase change material (PCM) has a central portion and a plurality of portions extending from the central portion to the plurality of PRAM cells.

48. The method according to claim 47, wherein the central portion of the common phase change material (PCM) has a diamond-shape.

49. The method according to claim 37, wherein the common phase change material (PCM) has a rectangular-shaped layout or square-shaped layout.

50. The method according to claim 37, wherein the PRAM arrangement is applied in an electronic device, selected from the group consisting of a set top box, music player, video player, entertainment unit, navigation device, communications device, personal digital assistant (PDA), fixed location data unit, and a computer, into which the PRAM arrangement is integrated.

51. A phase-change random access memory (PRAM) cell, comprising:
    a resistive means for generating heat; and
    a phase change means for allowing phase change coupled to the resistive means;
    a second electrode means for electrically connecting the PRAM cell coupled to the phase change means; and
    a second interconnect means for providing electrical connection to the second electrode means the second interconnect means having an axis;
wherein the resistive means is radially disposed with respect to the axis of the second interconnect means and wherein an active region between the resistive means and the phase change means is defined by a thickness of the resistive means.

52. The PRAM cell according to claim 51, further comprising:
    first electrode means for electrically connecting the PRAM cell coupled to the resistive means.

53. The PRAM cell according to claim 52, further comprising:
    first interconnect means for interconnecting the first electrode means to the resistive means.

54. The PRAM cell according to claim 51, further comprising:
    cap means for capping the resistive means.

55. The PRAM cell according to claim 54, wherein forming the phase change means includes depositing the phase change means at a predetermined thickness such that a top surface of the phase change means is level with or above a top surface of the cap means.

56. The PRAM cell according to claim 51, wherein forming the phase change means includes depositing the phase change means at a predetermined thickness such that a top surface of the phase change means is above a top surface of the resistive means.

57. The PRAM cell according to claim 51, wherein an active region of the phase change means is at a predetermined distance from a top surface of the phase change means.

58. The PRAM cell according to claim 51, wherein the PRAM cell is applied in an electronic device, selected from the group consisting of a set top box, music player, video player, entertainment unit, navigation device, communications device, personal digital assistant (PDA), fixed location data unit, and a computer, into which the PRAM cell is integrated.

59. A method of forming a phase-change random access memory (PRAM) cell, the method comprising:
    step for forming a heater resistor;
    step for forming a phase change material (PCM) coupled to the heater resistor;
    step for forming a top electrode coupled to the phase change material (PCM); and
    step for forming a second via interconnect that is coupled to the to electrode, the second via interconnect having an axis;
wherein the heater resistor is radially disposed with respect to the axis of the second via interconnect and wherein an active region between the heater resistor and the phase change material (PCM) is defined by a thickness of the heater resistor.

60. The method according to claim 59, further comprising:
    step for forming a bottom electrode, wherein the heater resistor is coupled to the bottom electrode.

61. The method according to claim 60, further comprising:
    step for forming a first via interconnect that couples the bottom electrode to the heater resistor.

62. The method according to claim 59, further comprising:
    step for forming a cap film over the heater resistor.

63. The method according to claim 62, wherein forming the phase change material (PCM) includes depositing the phase change material (PCM) at a predetermined thickness such that a top surface of the phase change material (PCM) is level with or above a top surface of the cap film.

64. The method according to claim 59, wherein forming the phase change material (PCM) includes depositing the phase change material (PCM) at a predetermined thickness such that a top surface of the phase change material (PCM) is above a top surface of the heater resistor.

65. The method according to claim 59, wherein an active region of the phase change material (PCM) is at a predetermined distance from a top surface of the phase change material (PCM).

66. The method according to claim 59, wherein the PRAM cell is applied in an electronic device, selected from the group consisting of a set top box, music player, video player, entertainment unit, navigation device, communications device, personal digital assistant (PDA), fixed location data unit, and a computer, into which the PRAM cell is integrated.

* * * * *